United States Patent
Tachibana

(10) Patent No.: US 7,095,452 B2
(45) Date of Patent: Aug. 22, 2006

(54) CLAMP CIRCUIT FOR CLAMPING A DIGITAL VIDEO SIGNAL

(75) Inventor: Masanori Tachibana, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 500 days.

(21) Appl. No.: 10/697,332

(22) Filed: Oct. 31, 2003

(65) Prior Publication Data

US 2004/0130375 A1    Jul. 8, 2004

(30) Foreign Application Priority Data

Jan. 8, 2003    (JP)    ............................... 2003-002493

(51) Int. Cl.
  *H04N 5/04*    (2006.01)
  *H04N 5/16*    (2006.01)
  *H04N 5/18*    (2006.01)
  *H04N 5/57*    (2006.01)

(52) U.S. Cl. ........................ 348/691; 348/689; 327/309

(58) Field of Classification Search ................ 348/687, 348/689, 690, 691, 257; H04N 5/04, 5/18, H04N 5/57
See application file for complete search history.

(56) References Cited

U.S. PATENT DOCUMENTS

| 5,341,218 | A | * | 8/1994 | Kaneko et al. ............. 348/695 |
| 5,508,749 | A | * | 4/1996 | Matsuo ........................ 348/500 |
| 5,907,655 | A | * | 5/1999 | Oguro ........................... 386/94 |
| 6,462,782 | B1 | * | 10/2002 | Honda et al. ................ 348/465 |
| 6,580,465 | B1 | * | 6/2003 | Sato ............................. 348/689 |
| 6,909,467 | B1 | * | 6/2005 | Kuzumoto et al. .......... 348/468 |
| 7,030,936 | B1 | * | 4/2006 | Sasada ......................... 348/691 |
| 2002/0047934 | A1 | * | 4/2002 | Nitta et al. .................. 348/689 |
| 2003/0001976 | A1 | * | 1/2003 | Sasada ......................... 348/691 |

FOREIGN PATENT DOCUMENTS

| JP | 06-133184 | 5/1994 |
| JP | 11-88723 | 3/1999 |

* cited by examiner

*Primary Examiner*—Brian P. Yenke
(74) *Attorney, Agent, or Firm*—Leydig, Voit & Mayer, Ltd.

(57) ABSTRACT

A clamp control circuit outputs a clamp control signal after a delay of a predetermined time if a digital video signal is detected. A sampling circuit that extracts sampling data of a pedestal level from a luminance corrected signal based on a clamp pulse at a timing of the back porch. A data averaging circuit calculates an average of the sampling data of the pedestal level. A data holding circuit holds a difference between the average and a digital signal processing reference level when the clamp control signal is output and also when the clamp control signal is not output. A level correction circuit corrects a level of the luminance signal based on the difference held by the data holding circuit and outputs the corrected luminance signal.

7 Claims, 2 Drawing Sheets

CLAMP CIRCUIT FOR CLAMPING A DIGITAL VIDEO SIGNAL

BACKGROUND OF THE INVENTION

1) Field of the Invention

The present invention relates to a clamp circuit that converts a video signal to a digital signal and conducts digital signal processing.

2) Description of the Related Art

The picture, quality of the television receiver sets is becoming better and better and the screen size is becoming large and larger day by day. To cope with this progress, there is a tendency to convert an analog video signal to a digital signal and perform some kind of digital signal processing to the digital signal. An analog-digital (A-D) converter is used to perform the conversion. During such conversion, the video signal is clamped in such a manner that the video signal does not exceed a dynamic range of the A-D converter.

While the video signal travels through different components of the circuitry, until it reaches to a digital signal processing circuit, which performs the digital signal processing, a DC level of the video signal undergoes variations. Therefore, even if the video signal is clamped, there is no guarantee that the video signal is securely suppressed at or below a reference level necessary for the digital signal processing.

In other words, by merely clamping the video signal, it is difficult to match the pedestal level. In video signal processing, the pedestal level inserted in the back porch of the horizontal blanking interval becomes the reference of luminance signal processing. When the pedestal level varies, combing or flicker occurs and the image is disturbed. The image with the combing or flicker occurring therein not only is hard to see, but also exerts a bad influence on eyes. Therefore, a method and means that will securely clamp the pedestal level of the video signal is in demand.

For example, in the conventional technology (see, for example, Japanese Patent Application Laid-Open No. 11-88723), the pedestal level is detected from the quantized video signal every field, and detected data are averaged. When a variation of the averaged pedestal level exceeds a predetermined error range, the detected pedestal level is chosen as a new pedestal level. When a variation of the detected pedestal level is within the predetermined error range, the pedestal level detected previously is chosen intactly as the pedestal level. In other words, when the variation of the pedestal level detected every field is within the predetermined error range, the pedestal level is fixed. The video signal is corrected by using a difference between the pedestal level thus determined and a pedestal level of a desired value. Flicker caused by the quantization error in the video signal obtained by converting the analog video signal to the digital signal, i.e., in the quantized video signal is thus suppressed.

When the error range of the pedestal level is made small in the conventional art, however, the pedestal level frequently varies. This results in a problem that occurrence of the combing or flicker cannot be completely prevented.

When the number of times of pedestal level quantization in a field is small, or when the number of bits in quantization is small, the computation error becomes large and the pedestal level frequently varies. This results in a problem that the number of times of sampling must be increased and the number of bits in quantization must be increased. In other words, the average must be calculated with the number of quantization times and the number of bits in quantization increased by using a high-performance A-D converter. This results in a problem that the circuit scale becomes large.

SUMMARY OF THE INVENTION

It is an object of the present invention to at least solve the problems in the conventional technology.

The clamp circuit according to the present invention includes a converter that converts an input analog video signal to a digital video signal; a separation unit that separates a chroma signal and a luminance signal from the digital video signal; a clamp control circuit that monitors the digital video signal and outputs a clamp control signal in response to a monitoring result of the digital video signal after a predetermined time for extracting a pedestal level inserted in a back porch included in a horizontal banking interval of the analog video signal has elapsed; and a clamp processing circuit that, while the clamp control circuit does not output the clamp control signal, extracts the pedestal level from a corrected luminance signal output from the clamp processing circuit, conducts computation processing to converge the extracted pedestal level to a digital signal processing reference level, and corrects the luminance signal input to the clamp processing circuit based on a result of the computation processing to output the corrected luminance signal, and once the clamp control circuit outputs the clamp control signal, holds a result of the computation processing at the time the clamp control circuit outputs the clamp control signal, and corrects the luminance signal input to the clamp processing circuit based on the held result to output the corrected luminance signal.

The other objects, features and advantages of the present invention are specifically set forth in or will become apparent from the following detailed descriptions of the invention when read in conjunction with the accompanying drawings.

DETAILED DESCRIPTION

Exemplary embodiments of a clamp circuit according to the present invention are explained in detail below with reference to the accompanying drawings.

Figure 1:
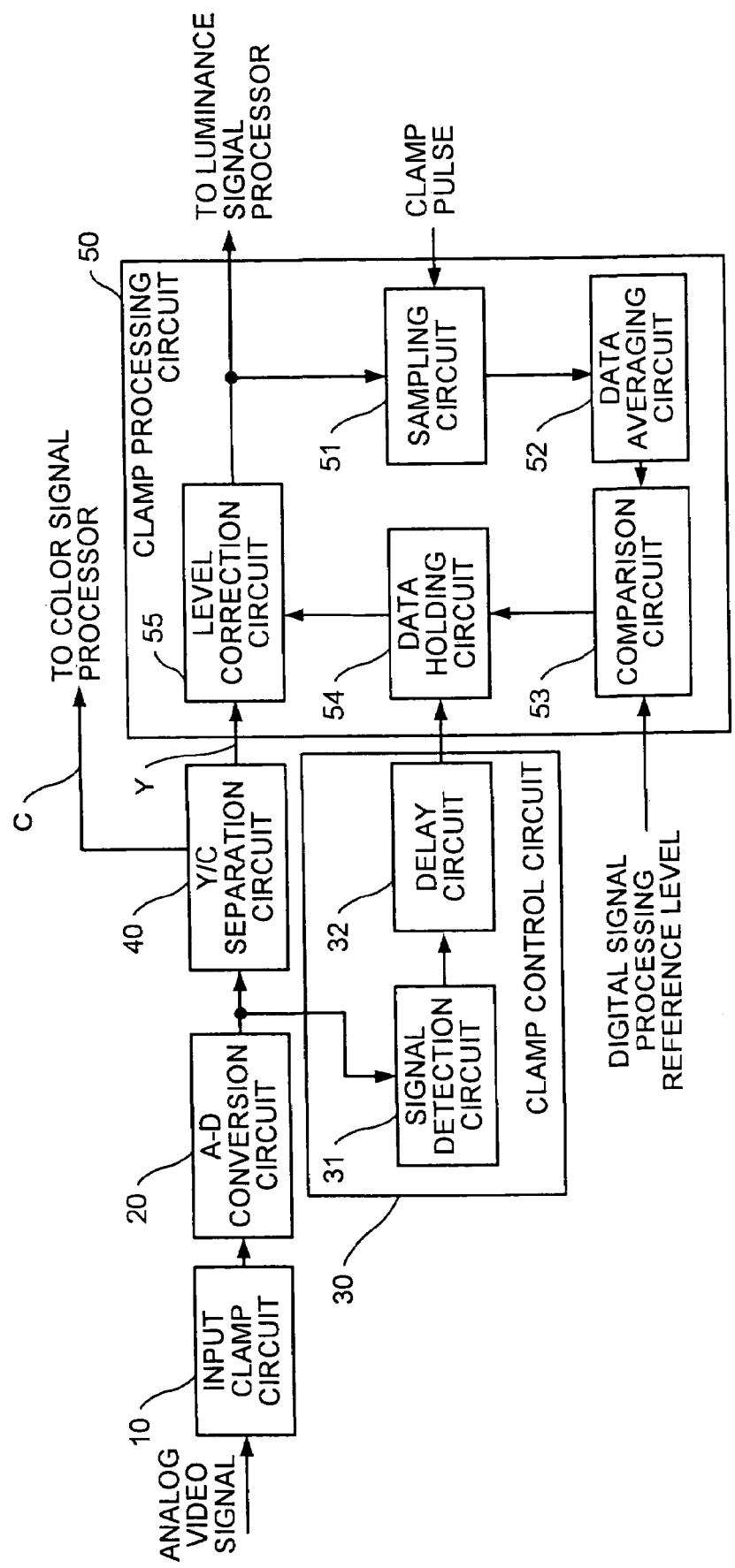
FIG. 1 is a block diagram of a clamp circuit according to an embodiment of the present invention.

FIG. 1 is a block diagram of a clamp circuit according to one embodiment of the present invention. The clamp circuit of the present embodiment includes an input clamp circuit 10, an A-D conversion circuit 20, a clamp control circuit 30, a Y/C separation circuit 40, and a clamp processing circuit 50.

The input clamp circuit 10 clamps an analog video signal to a DC level that does not exceed a dynamic range of the A-D conversion circuit 20, and outputs the analog video signal clumped to the A-D conversion circuit 20.

The A-D conversion circuit 20 converts the analog video signal clamped by the input clamp circuit 10 to a digital video signal, and outputs the digital video signal obtained by the conversion to the Y/C separation circuit 40 and the clamp control circuit 30. The conversion time during which the A-D conversion circuit 20 converts the analog video signal to the digital video signal is set so that data sufficient to demodulate the video signal may be obtained and at least the pedestal level inserted in the back porch may be sampled a plurality of times.

The clamp control circuit 30 has a function of outputting a clamp control signal in order to control the clamp processing circuit 50. The clamp control circuit 30 includes a signal detection circuit 31 and a delay circuit 32.

The signal detection circuit 31 observes a change of the digital video signal input from the A-D conversion circuit 20 and conducts detection to determine whether there is a digital video signal. In other words, a digital video signal is input by a change in the output of the A-D conversion circuit 20, and start of the digital signal processing is sensed. When a digital video signal is detected, a signal detection signal is output to the delay circuit 32.

The delay circuit 32 outputs a clamp control signal generated by delaying the signal detection signal by a predetermined time, to the clamp processing circuit 50. As for the delay time provided for the signal detection signal by the delay circuit 32, a time sufficient to converge the pedestal level in the clamp processing circuit 50 is determined by studying simulation or the like.

The Y/C separation circuit 40 separates a luminance signal Y and a chroma signal C from the digital video signal. The digital video signal contains the luminance signal Y having information of brightness and the chroma signal C having information of chromaticity. The Y/C separation circuit 40 separates these two signals, outputs the luminance signal Y to the clamp processing circuit 50, and outputs the chroma signal C to a chroma signal processor (not shown) that conducts color demodulation based on a color burst signal.

The clamp processing circuit 50 has a function of clamping the pedestal level based on the luminance signal Y at the time when a clamp pulse generated in a back porch interval included in a horizontal blanking interval of the video signal is "assert," i.e., data at the pedestal level, the digital signal processing reference level set for digitally processing the video signal, and a clamp control signal output from the clamp control circuit 30. The clamp processing circuit 50 includes a sampling circuit 51, a data averaging circuit 52, a comparison circuit 53, a data holding circuit 54, and a level correction circuit 55.

The level correction circuit 55 adds the luminance signal Y separated at the Y/C separation circuit 40 and an output of the data holding circuit 54, thereby corrects the luminance signal, and outputs the corrected luminance signal to the sampling circuit 51. The level correction circuit 55 outputs the corrected luminance signal to a luminance signal processor (not shown) that conducts a brightness adjustment.

The sampling circuit 51 outputs the corrected luminance signal input from the level correction circuit 55 at the time when the clamp pulse generated in the back porch interval included in the horizontal blanking interval is "assert," to the data averaging circuit 52. In other words, the corrected luminance signal for the pedestal level inserted in the back porch, from among corrected luminance signals, is output to the data averaging circuit 52.

The data averaging circuit 52 averages the data of the pedestal level, and outputs an average of the pedestal level inserted in the back porch to the comparison circuit 53. The pedestal level inserted in the back porch is subject to sampling in the A-D conversion circuit 20. Therefore, the pedestal level is converted to a plurality of digital data. The data averaging circuit 52 calculates an average of those data, and determines a value of the pedestal level in the field.

The comparison circuit 53 compares the average of the pedestal level with a digital signal processing reference level, and outputs a difference between them to the data holding circuit 54.

The data holding circuit 54 holds the difference between the average of the pedestal level and the digital signal processing reference level output from the comparison circuit 53 based on the clamp control signal input from the clamp control circuit 30, and outputs the difference thus held to the level correction circuit 55.

The clamp circuit of the present embodiment operates in the following manner. The input clamp circuit 10 clamps the analog video signal to such a DC level that the dynamic range of the A-D conversion circuit 20 is not exceeded. The input clamp circuit 10 outputs the clamped analog video signal to the A-D conversion circuit 20.

The A-D conversion circuit 20 converts the clamped analog video signal to a digital video signal, and outputs the digital video signal obtained by the conversion, to the Y/C separation circuit 40 and the signal detection circuit 31.

The signal detection circuit 31 conducts detection to determine whether there is a digital video signal. To be concrete, the signal detection circuit 31 determines whether the digital video signal input from the A-D conversion circuit 20 changes with a sampling period, and conducts detection to determine whether an analog video signal has been input to the clamp circuit. When the signal detection circuit 31 detects a digital video signal, it outputs a signal detection signal to the delay circuit 32.

The delay circuit 32 outputs the clamp control signal obtained by delaying the signal detection signal by a predetermined time, to the data holding circuit 54.

On the other hand, the Y/C separation circuit 40 separates the luminance signal Y and the chroma signal C from the digital video signal, outputs the luminance signal Y to the level correction circuit 55, and outputs the chroma signal C to a color demodulation processor (not shown).

The level correction circuit 55 outputs the corrected luminance signal obtained by adding the output of the data holding circuit 54 to the luminance signal, to the sampling circuit 51, and outputs the corrected luminance signal to the luminance signal processor (not shown), that conducts an adjustment on brightness, as well.

The sampling circuit 51 outputs the corrected luminance signal to the data averaging circuit 52 when the clamp pulse pulse generated during the back porch interval included in the horizontal blanking interval is "assert." In other words, the sampling circuit 51 outputs the corrected luminance signal for the pedestal level inserted in the back porch to the data averaging circuit 52.

The data averaging circuit 52 calculates the average of the corrected luminance signal for the pedestal level, and outputs it to the comparison circuit 53. In other words, the data averaging circuit 52 outputs the pedestal level in the field to the comparison circuit 53.

The comparison circuit 53 compares the average of the pedestal with the digital signal processing reference level, and calculates the difference between these two signals. The comparison circuit 53 outputs the difference to the data holding circuit 54.

When the clamp control signal is not input, i.e., when the pedestal level does not converge, the data holding circuit 54 takes in the difference between the average of the pedestal level and the digital signal processing reference level input from the comparison circuit 53, and outputs the difference to the level correction circuit 55.

Thus, when the clamp control signal is not input, then the sampling circuit 51, the data averaging circuit 52, the comparison circuit 53, the data holding circuit 54 and the level correction circuit 55 constitute a feedback loop, and repeat operation of calculating the difference between the pedestal level inserted in the back porch and the digital signal processing reference level, correcting the level of the luminance signal Y, and outputting the corrected luminance signal. In other words, those circuits function so as to converge the pedestal level to the digital signal processing reference level.

When the clamp control signal is input, then the data holding circuit 54 holds the difference between the average of the pedestal level and the digital signal processing reference level input from the comparison circuit 53, and thereafter the data holding circuit 54 does not take in the difference from the comparison circuit 53. In other words, the data holding circuit 54 locks the feedback loop and fixes the difference output to the level correction circuit 55.

When the analog video signal is input to the clamp circuit in the present embodiment, then the clamp circuit converges the pedestal level to the digital signal processing reference level as heretofore explained while repeating the operation of converting the analog video signal to the digital signal, calculating the difference between the average of the pedestal level inserted in the back porch and the digital signal processing reference level, and correcting the luminance signal. After a time sufficient for the pedestal level to converge to the digital signal processing reference level has elapsed since the analog video signal is input to the clamp circuit, the clamp circuit locks the operation and fixes the difference to be used to correct the luminance signal. As a result, it is possible to simplify the control conducted to stop the operation of converging the pedestal level to the digital signal processing reference level and fixing the difference to be used to correct the luminance signal, suppress the variation of the convergence level with time caused by an error in the computation for the pedestal level averaging with a small circuit scale, and obtain an image free from the combing or flicker.

Figure 2:
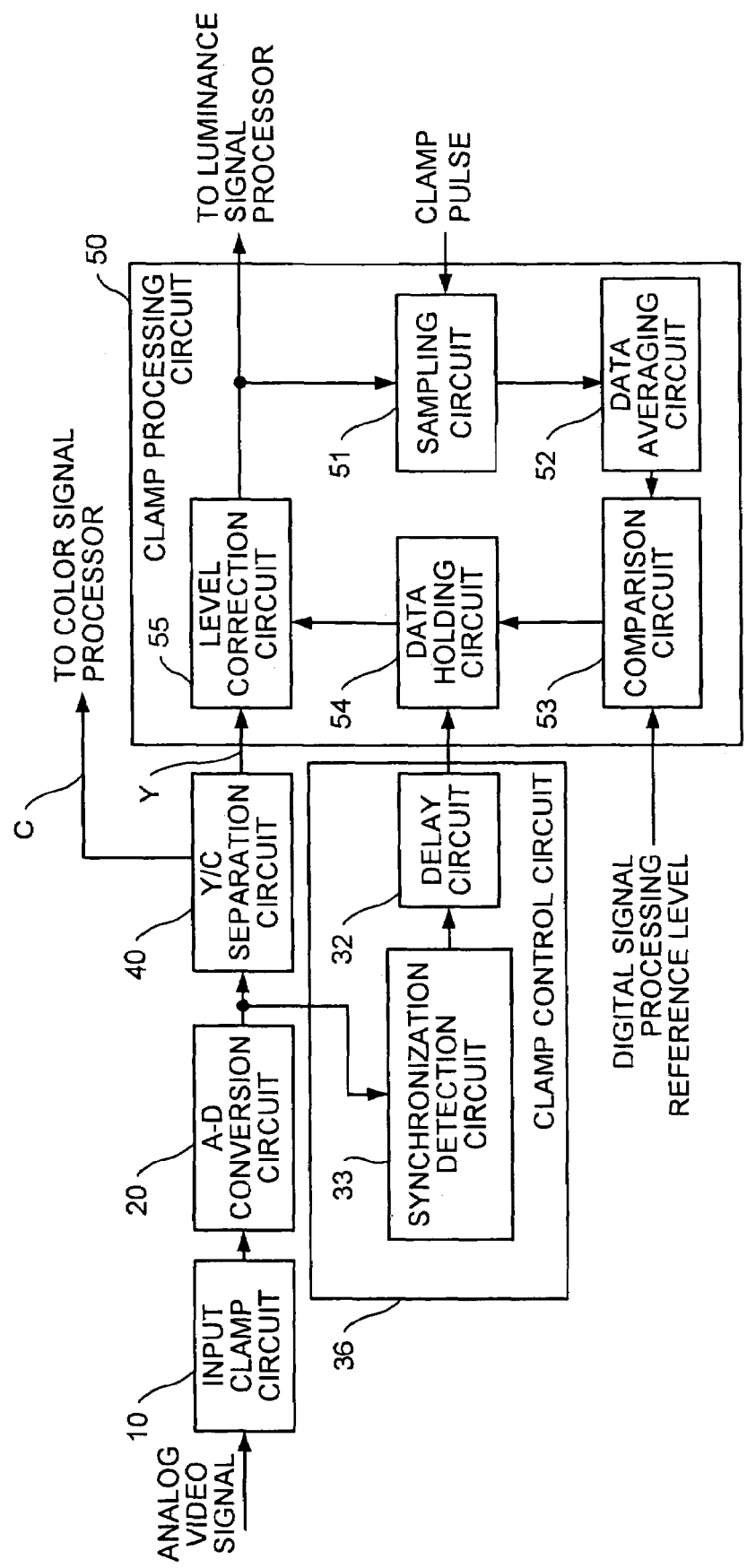
FIG. 2 is a block diagram of a clamp circuit according to another embodiment of the present invention.

FIG. 2 is a block diagram of a clamp circuit according to another embodiment of the present invention. This clamp circuit is different from the same in the earlier embodiment in that a clamp control circuit 36 is provided instead of the clamp control circuit 30. In other words, the clamp control signal is generated by using a synchronization detection circuit 33 instead of the signal detection circuit 31. Components having the same or similar functions or having the same or similar configuration as those shown in FIG. 1 are denoted by like characters, and their explanation is omitted to avoid simple repetition of explanation.

Upon detecting a horizontal synchronizing signal from the digital video signal, the synchronization detection circuit 33 outputs a synchronization detection signal to the delay circuit 32. In other words, start of the digital signal processing is sensed by using the horizontal synchronizing signal. The delay circuit 32 delays the synchronization detection signal by a predetermined time and outputs the clamp control signal to control the data holding circuit 54. In other words, the delay circuit outputs the clamp control signal a fixed time after the first detected horizontal synchronizing signal, and locks the feedback loop of the clamp processing circuit 50.

Even when the clamp control signal is thus output to control the data holding circuit 54 a fixed time after the detection of the horizontal synchronizing signal, it is possible to simplify the control conducted to stop the operation of converging the pedestal level to the digital signal processing reference level and fixing the difference to be used to correct the luminance signal, suppress the variation of the convergence level with time caused by an error in the computation for the pedestal level averaging with a small circuit scale, and obtain an image free from the combing or flicker.

Even when the synchronization detection circuit 33 is made to detect a vertical synchronizing signal and output the synchronization detection signal, effects similar to those obtained when detecting the horizontal synchronizing signal are obtained.

Typically, a video signal processing apparatus using the clamp circuit according to the present invention often incorporates a synchronization detection circuit. Therefore, it becomes possible to use the synchronization detection circuit included in the video signal processing apparatus without newly providing a synchronization detection circuit, and the circuit scale can be suppressed. At this time, the vertical synchronizing signal or the horizontal synchronizing signal may be detected from the analog video signal.

When the analog video signal is input to the clamp circuit according to the present invention, then the clamp circuit converges the pedestal level to the digital signal processing reference level as heretofore explained while repeating the operation of converting the analog video signal to the digital signal, calculating the difference between the average of the pedestal level inserted in the back porch and the digital signal processing reference level, and correcting the luminance signal. After a time sufficient for the pedestal level to converge to the digital signal processing reference level has elapsed since the analog video signal is input to the clamp circuit, the clamp circuit locks the operation and fixes the difference to be used to correct the luminance signal. As a result, it is possible to simplify the control conducted to stop the operation of converging the pedestal level to the digital signal processing reference level and fixing the difference to be used to correct the luminance signal, suppress the variation of the convergence level with time caused by an error in the computation for the pedestal level averaging with a small circuit scale, and obtain an image free from the combing or flicker.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A clamp circuit comprising:
   a converter that converts an input analog video signal to a digital video signal;
   a separation unit that separates a chroma signal and a luminance signal from the digital video signal;
   a clamp control circuit that monitors the digital video signal and outputs a clamp control signal in response to a monitoring result of the digital video signal after a predetermined time for extracting a pedestal level inserted in a back porch included in a horizontal banking interval of the analog video signal has elapsed; and
   a clamp processing circuit that,
      while the clamp control circuit does not output the clamp control signal, extracts the pedestal level from a corrected luminance signal output from the clamp processing circuit, conducts computation processing to converge the extracted pedestal level to a digital signal processing reference level, and corrects the luminance signal input to said clamp processing circuit based on a result of the computation processing to output the corrected luminance signal, and once the clamp control circuit outputs the clamp control signal, holds a result of the computation processing at the time the clamp control circuit outputs the clamp control signal, and corrects the luminance signal input to said clamp processing circuit based on the held result to output the corrected luminance signal.

2. The clamp circuit according to claim 1, wherein the clamp control circuit comprises:

a signal detection circuit that monitors a change in the digital video signal and outputs a signal detection signal, upon detecting that the digital video signal has changed; and a delay circuit that delays the signal detection signal by the predetermined time and outputs the delayed signal detection signal as the clamp control signal.

3. The clamp circuit according to claim 1, wherein the clamp control circuit comprises:

a synchronization detection circuit that outputs a synchronization detection signal, upon detecting a horizontal synchronizing signal from the digital video signal; and a delay circuit that delays the synchronization detection signal by the predetermined time and outputs the delayed synchronization detection signal as the clamp control signal.

4. The clamp circuit according to claim 1, wherein the clamp control circuit comprises:

a synchronization detection circuit that outputs a synchronization detection signal, upon detecting a vertical synchronizing signal from the digital video signal; and a delay circuit that delays the synchronization detection signal by the predetermined time and outputs the delayed synchronization detection signal as the clamp control signal.

5. The clamp circuit according to claim 1, wherein the clamp control circuit comprises:

a synchronization detection circuit that outputs a synchronization detection signal, upon detecting a horizontal synchronizing signal from the input analog video signal; and a delay circuit that delays the synchronization detection signal by the predetermined time and outputs the delayed synchronization detection signal as the clamp control signal.

6. The clamp circuit according to claim 1, wherein the clamp control circuit comprises:

a synchronization detection circuit that outputs a synchronization detection signal, upon detecting a vertical synchronizing signal from the input analog video signal; and a delay circuit that delays the synchronization detection signal by the predetermined time and outputs the delayed synchronization detection signal as the clamp control signal.

7. The clamp circuit according to claim 1, wherein the clamp processing circuit comprises:

a sampling circuit that extracts sampling data of a pedestal level from a corrected luminance signal based on a clamp pulse input to said sampling circuit at timing of the back porch;

a data averaging circuit that calculates an average of the sampling data of the pedestal level;

a calculating circuit that calculates a difference between the digital signal processing reference level and the average;

a data holding circuit that holds and provides the difference when the clamp control circuit outputs the clamp control signal and provides the difference when the clamp control circuit does not output the clamp control signal; and a level correction circuit that corrects a level of the luminance signal input to said clamp processing circuit based on the difference provided by the data holding circuit to output the corrected luminance signal.

* * * * *